United States Patent
Naka

(10) Patent No.: US 7,642,944 B2
(45) Date of Patent: Jan. 5, 2010

(54) A/D CONVERTER

(75) Inventor: Junichi Naka, Osaka (JP)

(73) Assignee: Panasonic Corporation, Osaka (JP)

( * ) Notice: Subject to any disclaimer, the term of this patent is extended or adjusted under 35 U.S.C. 154(b) by 267 days.

(21) Appl. No.: 11/919,235

(22) PCT Filed: Mar. 19, 2007

(86) PCT No.: PCT/JP2007/055544

§ 371 (c)(1),
(2), (4) Date: Oct. 25, 2007

(87) PCT Pub. No.: WO2008/035467

PCT Pub. Date: Mar. 27, 2008

(65) Prior Publication Data

US 2009/0195427 A1    Aug. 6, 2009

(30) Foreign Application Priority Data

Sep. 19, 2006  (JP) .............................. 2006-252353

(51) Int. Cl.
H03M 1/36   (2006.01)
(52) U.S. Cl. ...................... 341/159; 341/155
(58) Field of Classification Search ................. 341/155, 341/159
See application file for complete search history.

(56) References Cited

U.S. PATENT DOCUMENTS

| 5,164,728 A | * | 11/1992 | Matsuzawa et al. ......... 341/159 |
| 5,420,587 A | * | 5/1995 | Michel ........................ 341/156 |
| 6,281,828 B1 | * | 8/2001 | Kimura et al. ............... 341/155 |
| 6,404,374 B1 | * | 6/2002 | Yu et al. ...................... 341/159 |
| 6,707,413 B2 | * | 3/2004 | Sushihara et al. ............ 341/159 |
| 7,061,419 B2 | | 6/2006 | Sushihara et al. |
| 2004/0222911 A1 | | 11/2004 | Nakajima |
| 2006/0055578 A1 | | 3/2006 | Sushihara et al. |

FOREIGN PATENT DOCUMENTS

| JP | 04-043718 | 2/1992 |
| JP | 10-285034 | 10/1998 |
| JP | 2003-158456 | 5/2003 |
| JP | 2004-336583 | 11/2004 |
| JP | 2006-087064 | 3/2006 |

* cited by examiner

*Primary Examiner*—Khai M Nguyen
(74) *Attorney, Agent, or Firm*—McDermott Will & Emery LLP

(57) ABSTRACT

A full-flash A/D converter, including a differential amplifier circuit row and a voltage comparison circuit row, has an adjusting circuit 107 for making the output dynamic range of differential amplifier circuits accurately fall within the input dynamic range of voltage comparison circuits. The adjusting circuit 107 includes a reference voltage generation circuit 119, which has therein voltage generation circuits 122 whose resistors are connected in series. By this series connection, the area of the voltage generation circuits 122 is reduced, while the output dynamic range of the differential amplifier circuits A1 to Am+1 in the differential amplifier circuit row 102 accurately falls within the input dynamic range of the voltage comparison circuits Cr1 to Crm+1 in the voltage comparison circuit row 103. Furthermore, half-circuits in the voltage generation circuits 122 are used to generate reference voltages, whereby the area of the voltage generation circuits is reduced further.

9 Claims, 9 Drawing Sheets

A1 DIFFERENTIAL AMPLIFIER CIRCUIT ated Japanese Application No. 2006-252353, filed on Sep. 19, filed on Mar. 19, 2007, which in turn claims the benefit of
A/D CONVERTER

RELATED APPLICATIONS

This application is the U.S. National Phase under 35 U.S.C. § 371 of International Application No. PCT/JP2007/055544, filed on Mar. 19, 2007, which in turn claims the benefit of Japanese Application No. 2006-252353, filed on Sep. 19, 2006, the disclosure of which Applications are incorporated by reference herein.

TECHNICAL FIELD

The present invention relates to an A/D converter, and particularly relates to a technique for reducing the area of an A/D converter, while preventing degradation of the A/D conversion characteristics caused by variation in power supply voltage, in temperature, and in semiconductor device characteristics, etc.

BACKGROUND ART

FIG. 7 shows the configuration of a conventional A/D converter. The A/D converter shown in FIG. 7 is a full-flash A/D converter and includes a referential voltage generation circuit 601, a differential amplifier circuit row 602, a voltage comparison circuit row 603, and an encoder 605.

The referential voltage generation circuit 601 divides a voltage between a high-voltage reference voltage supplied to a high-voltage terminal 601H and a low-voltage reference voltage supplied to a low-voltage terminal 601L by m+1 resistors R1 to Rm+1, thereby generating m+1 referential voltages VR1 to VRm+1. The generated referential voltages VR1 to VRm+1 are input to the differential amplifier circuit row 602. The differential amplifier circuit row 602 has m+1 differential amplifier circuits A1 to Am+1. Each of these differential amplifier circuits simultaneously amplifies a differential voltage between an analog signal voltage AIN input from an analog signal voltage input terminal 604 and a corresponding one of the referential voltages VR1 to VRm+1 and outputs a positive output voltage and a negative output voltage, which are complementary voltages. The voltage comparison circuit row 603 has m+1 voltage comparison circuits Cr1 to Crm+1. Each of these voltage comparison circuits Cr1 to Crm+1 simultaneously compares the magnitudes of the positive and negative output voltages from a corresponding one of the differential amplifier circuits provided in the previous stage. The encoder 605 converts the m+1 comparison results output from the voltage comparison circuit row 603 and outputs a digital data signal DOUT having a predetermined resolution from a digital data output terminal 606.

The conventional A/D converter having the above-described parallel structure has the advantage of being capable of performing high-speed A/D conversion over various A/D converters, such as integrating A/D converters, serial-parallel A/D converters, and pipeline A/D converters, while having a disadvantage in that as the resolution increases, the number of differential amplifier circuits and the number of voltage comparison circuits are increased to cause the A/D converter to consume more power and occupy a larger area.

As an A/D converter in which this disadvantage has been overcome, a technique is disclosed in Patent Document 1, for example, in which voltage interpolation is performed by dividing the outputs of differential amplifier circuits by resistors or the like. In this technique, a voltage between the output voltages of each two adjacent differential amplifier circuits is interpolated, and the interpolated voltages are used in voltage comparison by voltage comparison circuits. Thus, as compared with a case in which no interpolation is performed, the number of differential amplifier circuits decreases by a factor of the interpolation bits, thereby reducing the power consumption and the occupied area.

Furthermore, an A/D converter which uses dynamic voltage comparison circuits as voltage comparison circuits is also disclosed by Patent Document 2, for example, as an A/D converter in which power consumption is reduced further. In this technique, dynamic voltage comparison circuits which do not need a constant current are used in place of high-speed operation, highly-responsive, constant-current voltage comparison circuits which are used in typical A/D converters, thereby enabling a significant reduction in power consumption.

In recent years, as semiconductor devices have been downsized, power supply voltage has been set at low levels. As a result, the input dynamic range of voltage comparison circuits has narrowed, imposing limits on the output dynamic range of differential amplifier circuits. This produces a problem in that due to variations in power supply voltage, in temperature, and in transistor characteristics, etc., the output dynamic range of the differential amplifier circuits changes and no longer matches the input dynamic range of the voltage comparison circuits, causing degradation of the accuracy of the A/D converter.

As an A/D converter in which this problem has been overcome, Patent Document 3, for example, discloses a technique for adjusting the output dynamic range of differential amplifier circuits to the input dynamic range of voltage comparison circuits. FIG. 8 shows the configuration of the A/D converter disclosed in Patent Document 3. The A/D converter shown in FIG. 8 is a full-flash A/D converter and includes a referential voltage generation circuit 701, a differential amplifier circuit row 702, a voltage comparison circuit row 703, an encoder 705, and an adjusting circuit 707.

The referential voltage generation circuit 701 divides a voltage between a high-voltage reference voltage supplied to a high-voltage terminal 701H and a low-voltage reference voltage supplied to a low-voltage terminal 701L by m+1 resistors R1 to Rm+1, thereby generating m+1 referential voltages VR1 to VRm+1. The generated referential voltages VR1 to VRm+1 are input to the differential amplifier circuit row 702. The differential amplifier circuit row 702 has m+1 differential amplifier circuits A1 to Am+1. Each of these differential amplifier circuits A1 to Am+1 simultaneously amplifies a differential voltage between an analog signal voltage AIN input from an analog signal voltage input terminal 704 and a corresponding one of the referential voltages VR1 to VRm+1 and outputs a positive output voltage and a negative output voltage, which are complementary voltages. The voltage comparison circuit row 703 has m+1 voltage comparison circuits Cr1 to Crm+1. Each of these voltage comparison circuits Cr1 to Crm+1 simultaneously compares the magnitudes of the positive and negative output voltages from a corresponding one of the differential amplifier circuits provided in the previous stage. The encoder 705 converts the m+1 comparison results output from the voltage comparison circuit row 703 and outputs a digital data signal DOUT having a predetermined resolution from a digital data output terminal 706. The configuration discussed so far is the same as the configuration of the previously described A/D converter.

The adjusting circuit 707, which is the key feature of the technique disclosed in Patent Document 3, includes a differential amplifier circuit replica 708, a voltage comparison circuit replica 709, a reference voltage output circuit 710, an operational amplifier circuit 711, an average voltage generation circuit 712, and a low pass filter 717. The differential amplifier circuit replica 708 has the same structure as the differential amplifier circuits A1 to Am+1 that form the differential amplifier circuit row 702. Two input voltages to the differential amplifier circuit replica 708 are the same voltage Vo, and the differential amplifier circuit replica 708 outputs a differential amplifier circuit common mode voltage 713. The voltage comparison circuit replica 709 has the same structure as the voltage comparison circuits Cr1 to Crm+1 that form the voltage comparison circuit row 703. The differential amplifier circuit common mode voltage 713 is input to the voltage comparison circuit replica 709. And a positive output voltage and a negative output voltage from the voltage comparison circuit replica 709 are input to average voltage generation resistors a712a and b712b, respectively, in the average voltage generation circuit 712, and a voltage comparison circuit common mode voltage 714, which is the average voltage of those positive and negative output voltages, is obtained. The reference voltage output circuit 710 outputs a reference voltage 715 falling within a predetermined range including the voltage comparison circuit common mode voltage 714 when the output dynamic range of the differential amplifier circuits A1 to Am+1 and of the differential amplifier circuit replica 708 is within the input dynamic range of the voltage comparison circuits Cr1 to Crm+1 and of the voltage comparison circuit replica 709. The operational amplifier circuit 711 receives the voltage comparison circuit common mode voltage 714 output from the average voltage generation circuit 712 and the reference voltage 715 output from the reference voltage output circuit 710 and outputs a feedback control voltage 716 so that the voltage comparison circuit common mode voltage 714 and the reference voltage 715 match. The feedback control voltage 716 is connected to the low pass filter 717. The low pass filter 717, which is composed of a filter resistor 717R and a filter capacitor 717C, removes a high-frequency component from the feedback control voltage 716 to obtain a post-low-pass-filtering feedback control voltage 718. The post-low-pass-filtering feedback control voltage 718 is fed back to the differential amplifier circuit replica 708 and to the differential amplifier circuits A1 to Am+1.

The reference voltage output circuit 710 includes a reference voltage generation circuit 719, a decoder 720, and a selection circuit 721. The reference voltage generation circuit 719 includes one or more voltage generation circuits 722 represented by reference marks Vref1 to Vrefn. Each voltage generation circuit 722 generates a different voltage that can be the reference voltage 715, and the generated voltage is connected with a corresponding one of the taps of the selection circuit 721. The decoder 720 receives an externally supplied control signal 723 indicated by a reference mark CS and outputs a selection signal 724 for controlling the selection circuit 721 according to the control signal 723. Thus, the reference voltage 715 is adjustable by the control signal 723.

The voltage comparison circuits Cr1 to Crm+1 have a circuit configuration shown in FIG. 3, for example. This circuit is a dynamic voltage comparison circuit characterized by high-speed operation and low power consumption, and the detailed operation thereof will be described later. On the other hand, the voltage generation circuits 722 disclosed in Patent Document 3 has a circuit configuration shown in FIG. 9, for example. This is almost the same as the configuration of the voltage comparison circuits Cr1 to Crm+1. The differences between the voltage comparison circuits Cr1 to Crm+1 and the voltage generation circuits 722 are as follows: an input transistor section 301 in the voltage comparison circuits Cr1 to Crm+1, which is composed of NMOS transistors, is replaced in the voltage generation circuits 722 with a resistor section 801 composed of two resistors R0a and R0b; a positive feedback section 302 in the voltage comparison circuits Cr1 to Crm+1 is replaced with a diode connection section 802 in the voltage generation circuits 722; reset sections 303 in the voltage comparison circuits Cr1 to Crm+1 are replaced with switch sections 803; and the gate terminals of the transistors forming the reset sections 303 in the voltage comparison circuits Cr1 to Crm+1 are connected with a clock terminal CLK, while the gate terminals of the transistors forming the switch sections 803 in the voltage generation circuits 722 are connected with a signal, which is always at the "High" level when the A/D converter operates. The gate terminal of a PMOS transistor m3a is connected to a reference voltage output terminal VREF.

The two resistors R0a and R0b in each voltage generation circuit 722 are connected at one end thereof to the source terminals of NMOS transistors m1a and m1b, respectively, of the diode connection section. The other end of each of the two resistors R0a and R0b in the voltage generation circuit 722 is connected with a ground voltage VSS. If the values of the two resistors R0a and R0b in each voltage generation circuit 722 included in the reference voltage generation circuit 719 differ from one voltage generation circuit 722 to another, the voltage generation circuits 722 can produce different voltages.

The configuration described above enables the output dynamic range of the differential amplifier circuits to accurately fall within the input dynamic range of the voltage comparison circuits, even if power supply voltage, temperature, transistor characteristics, or the like vary. It is thus possible to prevent the accuracy of the A/D converter from decreasing due to those variations. In addition, the reference voltage 715 is adjusted according to the received external control signal 723, whereby the operation margin can be increased further.

Patent Document 1: Japanese Laid-Open Publication No. 4-43718

Patent Document 2: Japanese Laid-Open Publication No. 2003-158456

Patent Document 3: Japanese Laid-Open Publication No. 2006-87064

DISCLOSURE OF THE INVENTION

Problem that the Invention Intends to Solve

However, to increase the adjustment range of the conventional reference voltage 715, the values of the two resistors R0a and R0b in each voltage generation circuit 722 included in the reference voltage generation circuit 719 must differ from one voltage generation circuit 722 to another.

In addition, to prevent variations occurring during semiconductor fabrication, the voltage generation circuits 722 are required to have the same layout shape. To meet this requirement, it is necessary to divide the two resistors R0a and R0b in each voltage generation circuit 722 into unit resistors, and then the same number of unit resistors as that provided in a voltage generation circuit 722 whose resistance value is the largest has to be disposed in the other voltage generation circuits 722. As a result, in each of those other voltage generation circuits 722, the unit resistors other than those actually needed to achieve the resistance values of the two resistors R0a and R0b are disposed uselessly as dummy resistors, causing a problem in that the area occupied by the reference voltage generation circuit 719 is increased.

In view of this problem, an object of the present invention is to provide an A/D converter in which a plurality of voltage generation circuits for reference voltage generation included for adjustment of the output dynamic range of differential amplifier circuits are configured so that the area occupied by a reference voltage generation circuit is reduced.

Means for Solving the Problem

In order to achieve the above object, according to the present invention, a plurality of voltage generation circuits for reference voltage generation are not configured in such a manner that each resistor in each voltage generation circuit by itself has a predetermined resistance value, but configured so that resistors in the voltage generation circuits are combined so as to have a predetermined resistance value, thereby enabling each resistor in each voltage generation circuit to be formed only of a resistor having a small resistance value. Thus, the A/D converter functions to make the output dynamic range of differential amplifier circuits accurately fall within the input dynamic range of voltage comparison circuits, while the area occupied by the reference voltage output circuit is reduced significantly.

Specifically, an inventive A/D converter includes: a referential voltage generation circuit for generating a plurality of referential voltages; a differential amplifier circuit row, in which a plurality of differential amplifier circuits corresponding to the referential voltages generated by the referential voltage generation circuit are included, each of the differential amplifier circuits receiving a corresponding one of the referential voltages and a common input signal voltage, amplifying a voltage difference between the corresponding referential voltage and the common input signal voltage, and outputting a positive output voltage and a negative output voltage, which are complementary voltages; a voltage comparison circuit row, in which a plurality of voltage comparison circuits corresponding to the differential amplifier circuits are included, each of the voltage comparison circuits outputting a digital signal according to a result of comparing the magnitudes of the positive and negative output voltages from a corresponding one of the differential amplifier circuits; an encoder for encoding the digital signals output from the voltage comparison circuits and outputting a result of the encoding of the digital signals as a digital output signal according to the common input signal voltage; and an adjusting circuit for adjusting the positive and negative output voltages from the differential amplifier circuits so that those positive and negative output voltages fall within an input range of the voltage comparison circuits, wherein the adjusting circuit includes a reference voltage output circuit, which has therein a plurality of voltage generation circuits each for generating a reference voltage and selects and outputs one of the reference voltages; the voltage generation circuits each include a resistor for reference voltage generation; and the resistors in at least two of the voltage generation circuits are connected in series.

In the inventive A/D converter, in the at least two voltage generation circuits whose resistors are connected in series, one of the series-connected resistors that is located at an end thereof is connected to a predetermined potential.

In the inventive A/D converter, each of the voltage comparison circuits includes: an input transistor section for receiving the positive and negative output voltages from the corresponding differential amplifier circuit, and a positive feedback section connected to the input transistor section and forming a cross inverter latch; each of the voltage generation circuits includes a diode connection section having the same configuration as the positive feedback sections in the differential amplifier circuits; and each of the voltage generation circuits includes two said resistors, and each of the two resistors is connected at one end thereof to the diode connection section and connected at the other end thereof to one end of a resistor in another voltage generation circuit.

In the inventive A/D converter, the adjusting circuit includes: a differential amplifier circuit replica, which has the same circuit and shape as the differential amplifier circuits, receives a feedback control voltage for output voltage adjustment supplied to the differential amplifier circuits, and outputs a differential amplifier circuit common mode voltage; a voltage comparison circuit replica, which has the same circuit and shape as the voltage comparison circuits, receives the differential amplifier circuit common mode voltage output from the differential amplifier circuit replica, and outputs a voltage comparison circuit common mode voltage according to the differential amplifier circuit common mode voltage; and an operational amplifier circuit for generating the feedback control voltage and feeding the feedback control voltage back to the differential amplifier circuit replica and to the differential amplifier circuits so that the voltage comparison circuit common mode voltage output from the voltage comparison circuit replica and the reference voltage selected and output by the reference voltage output circuit match.

In the inventive A/D converter, each of the voltage comparison circuits includes: an input transistor section for receiving the positive and negative output voltages from the corresponding differential amplifier circuit, and a positive feedback section connected to the input transistor section and forming a cross inverter latch; each of the voltage generation circuits includes two diode connection sections each having the same configuration as one of two symmetric half-circuits forming the positive feedback section in each of the differential amplifier circuits; and each of the voltage generation circuits includes two said resistors, the two resistors are connected at one end thereof to the two diode connection sections, and the other end of one of the two resistors is connected to the one end of the other resistor.

In the inventive A/D converter, the reference voltage output circuit includes a decoder for receiving an external control signal and generating a selection signal for selecting one of the voltage generation circuits in accordance with the control signal, and each of the voltage generation circuits operates when the voltage generation circuit receives the selection signal from the decoder, and stops when the voltage generation circuit does not receive the selection signal.

In the inventive A/D converter, the adjusting circuit further includes an average voltage generation circuit, provided between the voltage comparison circuit replica and the operational amplifier circuit, for receiving a positive output voltage and a negative output voltage output from the voltage comparison circuit replica and generating an average voltage of the positive and negative output voltages as the voltage comparison circuit common mode voltage, and the operational amplifier circuit generates the feedback control voltage so that the voltage comparison circuit common mode voltage output from the average voltage generation circuit matches the reference voltage selected and output by the reference voltage output circuit.

In the inventive A/D converter, the adjusting circuit further includes a low pass filter, disposed to an output side of the operational amplifier circuit, for removing a high-frequency component from the feedback control voltage output from the operational amplifier circuit.

In the inventive A/D converter, each of the resistors included in the voltage generation circuits is a combination of resistors having a positive temperature dependent characteristic, a combination of resistors having a negative temperature dependent characteristic, or a combination of resistors having a positive temperature dependent characteristic and a negative temperature dependent characteristic.

As described above, according to the present invention, in an A/D converter, in which a plurality of voltage generation circuits for reference voltage generation are included for adjustment of the output dynamic range of differential amplifier circuits, resistors included in the voltage generation circuits are connected in series with each other so that the voltage generation circuits have different resistance values, thereby enabling each resistor in each voltage generation circuit to be formed of a resistor having a small resistance value. This allows the area occupied by a reference voltage generation circuit to be reduced, while enabling the output dynamic range of the differential amplifier circuits to accurately fall within the input dynamic range of voltage comparison circuits, even if power supply voltage, temperature, or transistor characteristics vary. It is thus possible to increase the conversion accuracy of the A/D converter, while reducing the area occupied by the A/D converter. In particular, in a voltage generation circuit, resistors typically occupy a large area, for example, more than 50% of the entire area. However, according to the present invention, in a case where the number of adjustable reference voltages (i.e., the number of voltage generation circuits) is n, the area of the resistors is reduced to 1/n, which means that the present invention effectively reduces the area occupied by the reference voltage generation circuits.

Particularly, according to the present invention, the voltage generation circuits included in the reference voltage generation circuit only have diode connection sections whose configuration is not equal to the configuration of the entire circuit of a positive feedback section in each differential amplifier circuit but equal to the configuration of a half-circuit of the positive feedback section. The area of the voltage generation circuits are thus further reduced by half, resulting in a further reduction in the area of the A/D converter.

Also, according to the present invention, the voltage generation circuits included in the reference voltage generation circuit each stop their operation when they are not selected, thereby effectively reducing current consumption in the A/D converter.

Furthermore, according to the present invention, the voltage comparison circuit common mode voltage is obtained from the average value of the positive and negative output voltages of the voltage comparison circuit replica, such that fabrication variations can be prevented to thereby reduce variations in the characteristics of the A/D converter.

In addition, according to the present invention, a high-frequency component can be removed from the feedback control voltage by the low pass filter disposed to the output side of the operational amplifier circuit in the adjusting circuit, whereby degradation of the characteristics of the A/D converter due to noise is prevented.

Moreover, according to the present invention, since the temperature properties of the voltage comparison circuits and the temperature properties of the voltage generation circuits can be brought close to each other, degradation of the A/D converter caused by temperature variation is prevented.

Effects of the Invention

As described previously, according to the present invention, in an A/D converter, in which a plurality of voltage generation circuits for reference voltage generation are included for adjustment of the output dynamic range of differential amplifier circuits, each resistor in each voltage generation circuit is allowed to be formed of a resistor having a small resistance value. This permits the area occupied by a reference voltage generation circuit to be reduced, while enabling the output dynamic range of the differential amplifier circuits to accurately fall within the input dynamic range of voltage comparison circuits. It is thus possible to increase the conversion accuracy of the A/D converter, while reducing the area occupied by the A/D converter.

In particular, according to the present invention, the voltage generation circuits included in the reference voltage generation circuit are configured to only have diode connection sections whose configuration is equal to the configuration of a half-circuit of each positive feedback section in the differential amplifier circuits. The area of the voltage generation circuits are thus further reduced by half, allowing a further reduction in the area of the A/D converter.

BRIEF DESCRIPTION OF DRAWINGS

FIG. 5 shows how some of the voltage generation circuits are connected.

EXPLANATION OF THE REFERENCE CHARACTERS

Figure 1:
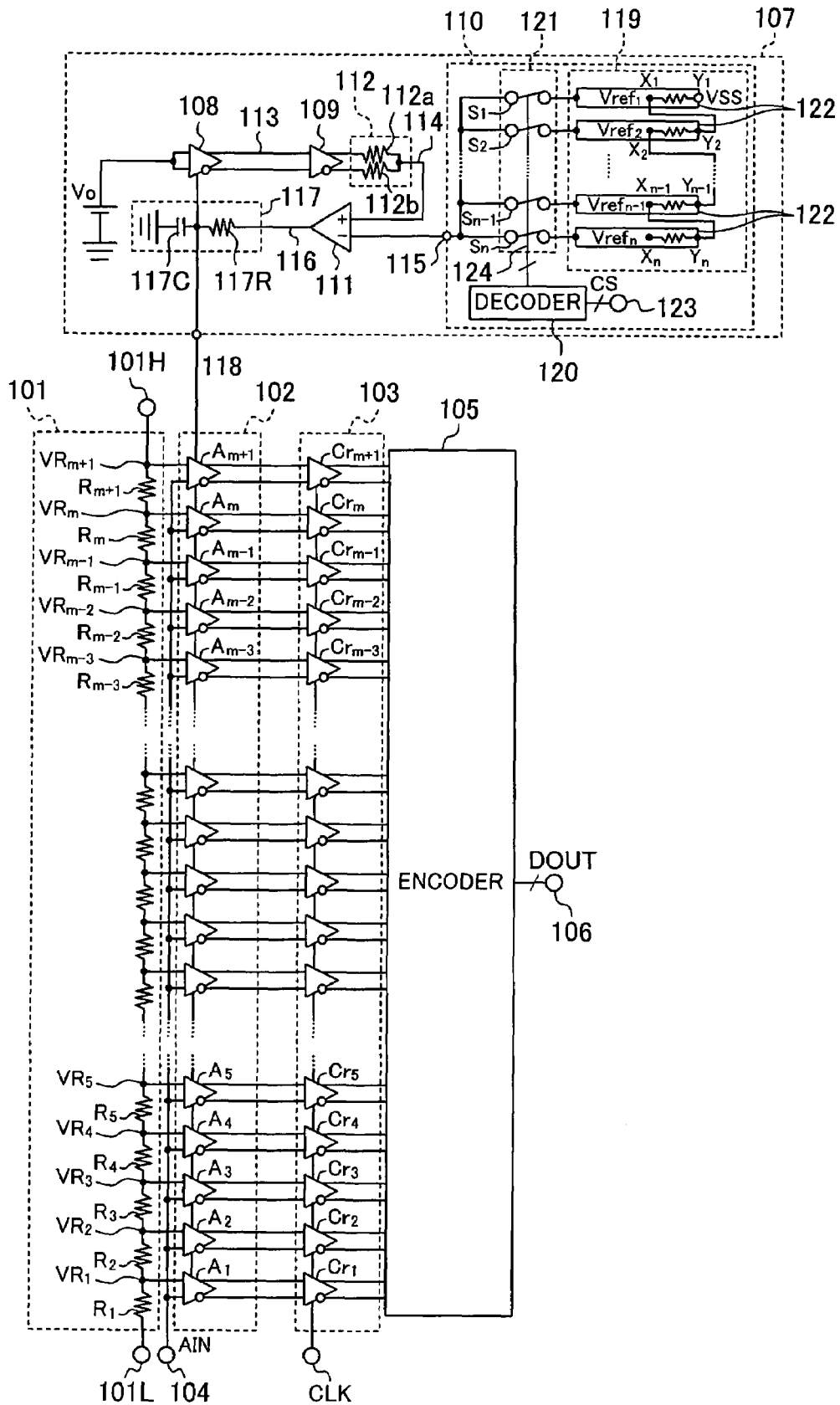
FIG. 1 is a view showing the entire configuration of an A/D converter according to an embodiment of the present invention.

101 Referential voltage generation circuit
102 Differential amplifier circuit row
103 Voltage comparison circuit row
104 Analog signal voltage input terminal
105 Encoder
106 Digital data output terminal
107 Adjusting circuit
108 Differential amplifier circuit replica
109 Voltage comparison circuit replica
110 Reference voltage output circuit
111 Operational amplifier circuit
112 Average voltage generation circuit
112a, 112b Average voltage generation resistor
113 Differential amplifier circuit common mode voltage
114 Voltage comparison circuit common mode voltage
115 Reference voltage
116 Feedback control voltage 117 Low pass filter
117R Filter resistor
117C Filter capacitor
118 Post-low-pass-filtering feedback control voltage
119 Reference voltage generation circuit
120 Decoder
121 Selection circuit
122 Voltage generation circuit
123 Control signal
124 Selection signal
301 Input transistor section
302 Positive feedback section
303 Reset section
401 Resistor section
402 Diode connection section
403 switch section
501a, 501b Resistor section
502a, 502b Diode connection section
503a, 504b Switch section

BEST MODE FOR CARRYING OUT THE INVENTION

Hereinafter, embodiments of an A/D converter according to the present invention will be described with reference to the accompanying drawings.

FIRST EMBODIMENT

FIG. 1 shows an example of an embodiment of an A/D converter according to the present invention. The A/D converter shown in FIG. 1 is a full-flash A/D converter and includes a referential voltage generation circuit 101, a differential amplifier circuit row 102, a voltage comparison circuit row 103, an encoder 105, and an adjusting circuit 107.

The referential voltage generation circuit 101 divides a voltage between a high-voltage reference voltage supplied to a high-voltage terminal 101H and a low-voltage reference voltage supplied to a low-voltage terminal 101L by m+1 resistors R1 to Rm+1, thereby generating m+1 referential voltages VR1 to VRm+1. The generated referential voltages VR1 to VRm+1 are input to the differential amplifier circuit row 102. The differential amplifier circuit row 102 has m+1 differential amplifier circuits A1 to Am+1. Each of these differential amplifier circuits has two input terminals, receives at one input terminal an analog signal voltage AIN input from an analog signal voltage input terminal 104, and receives at the other input terminal one of the referential voltages VR1 to VRm+1 that corresponds to that differential amplifier circuit. And the differential amplifier circuit amplifies a voltage difference between those input voltages and outputs a positive output voltage and a negative output voltage, which are complementary voltages. The voltage comparison circuit row 103 has m+1 voltage comparison circuits Cr1 to Crm+1 that operate in synchronization with a clock signal supplied to a clock terminal CLK. Each of the voltage comparison circuits Cr1 to Crm+1 simultaneously compares the magnitudes of the positive and negative output voltages produced from a corresponding one of the differential amplifier circuits provided in the previous stage. The encoder 105 converts the m+1 comparison results output from the voltage comparison circuit row 103 and outputs a digital data signal DOUT having a predetermined resolution from a digital data output terminal 106.

The adjusting circuit 107 includes a differential amplifier circuit replica 108, a voltage comparison circuit replica 109, a reference voltage output circuit 110, an operational amplifier circuit 111, an average voltage generation circuit 112, and a low pass filter 117. The differential amplifier circuit replica 108 has the same configuration as the differential amplifier circuits A1 to Am+1 that form the differential amplifier circuit row 102. Two input voltages to the differential amplifier circuit replica 108 are the same voltage Vo, and the differential amplifier circuit replica 108 outputs a differential amplifier circuit common mode voltage 113. The voltage comparison circuit replica 109 has the same configuration as the voltage comparison circuits Cr1 to Crm+1 that form the voltage comparison circuit row 103. Input voltage to the voltage comparison circuit replica 109 is the differential amplifier circuit common mode voltage 113. And positive and negative output voltages from the voltage comparison circuit replica 109 are input to average voltage generation resistors a112a and b112b, respectively, in the average voltage generation circuit 112, and a voltage comparison circuit common mode voltage 114, which is the average voltage of those positive and negative output voltages, is obtained. The reference voltage output circuit 110 outputs a reference voltage 115 falling within a predetermined range including the voltage comparison circuit common mode voltage 114 when the output dynamic range of the differential amplifier circuits A1 to Am+1 and of the differential amplifier circuit replica 108 is within the input dynamic range of the voltage comparison circuits Cr1 to Crm+1 and of the voltage comparison circuit replica 109. The operational amplifier circuit 111 receives the voltage comparison circuit common mode voltage 114 output from the average voltage generation circuit 112 and the reference voltage 115 output from the reference voltage output circuit 110 and outputs a feedback control voltage 116 so that the voltage comparison circuit common mode voltage 114 and the reference voltage 115 match. The feedback control voltage 116 is connected to the low pass filter 117. The low pass filter 117, which is composed of a filter resistor 117R and a filter capacitor 117C, removes a high-frequency component from the feedback control voltage 116 to obtain a post-low-pass-filtering feedback control voltage 118. The post-low-pass-filtering feedback control voltage 118 is fed back to the differential amplifier circuit replica 108 and to the differential amplifier circuits A1 to Am+1.

The reference voltage output circuit 110 includes a reference voltage generation circuit 119, a decoder 120, and a selection circuit 121. The reference voltage generation circuit 119 includes a plurality of voltage generation circuits 122 denoted by reference marks Vref1 to Vrefn, which are the most distinctive feature of the present invention. Each voltage generation circuit 122 generates a different voltage that can be the reference voltage 115, and the generated voltage is connected to one of the taps of the selection circuit 121. The detailed operation and configuration of the voltage generation circuits 122 will be described later. The decoder 120 receives an externally supplied control signal 123 indicated by a reference mark CS and outputs a selection signal 124 for controlling the selection circuit 121 according to the control signal 123. The selection signal 124 selects which of the switches S1 to Sn forming the selection circuit 121 is to be turned on, that is, selects one of the voltages generated by the voltage generation circuits 122 represented by the reference marks Vref1 to Vrefn, whereby the reference voltage 115 is adjusted.

Figure 2:
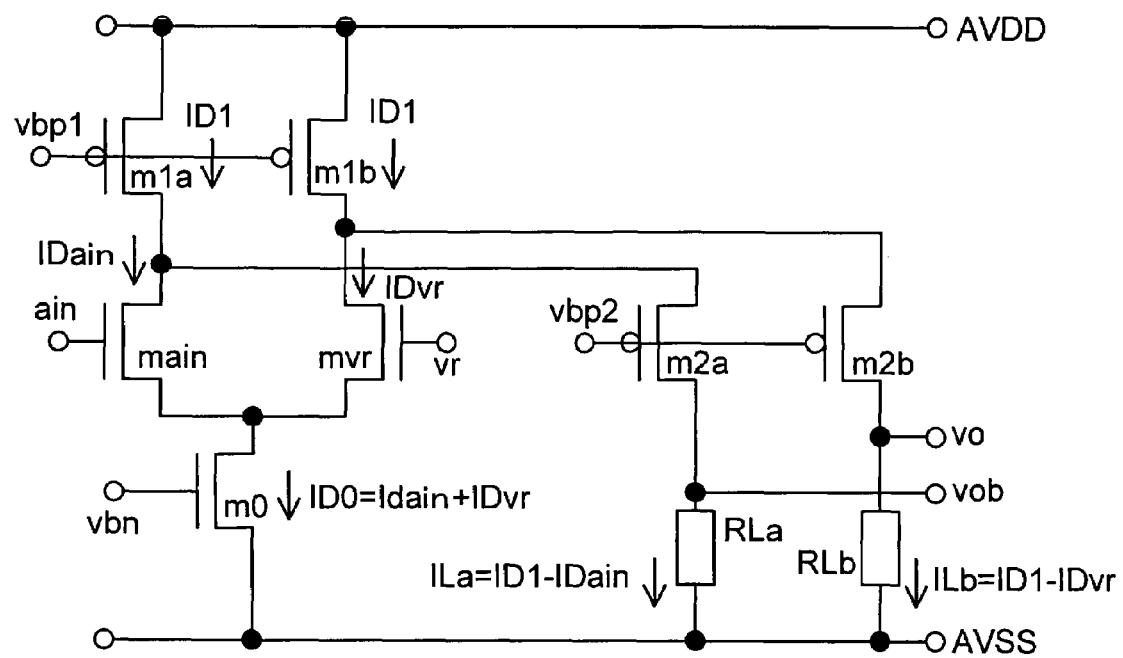
FIG. 2 a view showing an example of the internal configuration of a differential amplifier circuit included in the A/D converter.

FIG. 2 shows an example of the configuration of the differential amplifier circuits A1 to Am+1 forming the differential amplifier circuit row 102 or of the configuration of the differential amplifier circuit replica 108. The differential amplifier circuit A1 has two input terminals ain and vr. The analog signal voltage AIN input from the analog signal voltage input terminal 104 is input to the input terminal ain, and one of the referential voltages VR1 to VRm+1 that corresponds to each differential amplifier circuit is input to the input terminal vr. The input terminals are connected with the gate terminal of an NMOS transistor main and the gate terminal of an NMOS transistor mvr, respectively. The source terminals of the NMOS transistors main and mvr are connected with the drain terminal of an NMOS transistor m0. The source terminal of the NMOS transistor m0 is connected with a ground voltage AVSS, while the gate terminal thereof is connected to an externally supplied bias voltage vbn, such that a constant current ID0 passes through the NMOS transistor m0 in accordance with the bias voltage vbn. Currents IDain and IDvr pass through the NMOS transistors main and mvr, respectively, according to the respective voltages of the input terminals ain and vr. Thus, the relation ID0=IDain+IDvr is satisfied. The drain terminals of the NMOS transistors main and mvr are connected with the respective drain terminals of PMOS transistors m1a and m1b. The source terminals of the PMOS transistors m1a and m1b are connected to a power supply voltage AVDD, while the gate terminals thereof are connected to an externally supplied bias voltage vbp1, such that a constant current ID1 passes through the PMOS transistors m1a and m1b in accordance with the bias voltage vbp1. The connection point at which the two transistors main and m1a are connected together and the connection point at which the two transistors mvr and m1b are connected together are connected to the respective source terminals of PMOS transistors m2a and m2b. The drain terminals of the PMOS transistors m2a and m2b are connected to load resistors RLa and RLb, respectively. The gate terminals of the PMOS transistors m2a and m2b are connected to an externally supplied bias voltage vbp2. Thus, a current of ILa=ID1-IDain and a current of ILb=ID1-IDvr pass through the load resistors RLa and RLb, respectively. The differential amplifier circuit A1 has two output terminals vo and vob for producing complementary outputs, and the voltages thereof are vo=RLa×ILa=RLa (ID1-IDain) and vob=RLb×ILb=RLb (ID1-IDvr).

Changes in the analog signal voltage AIN cause a corresponding change in the currents IDain and IDvr, and according to the voltage change, the voltages vo and vob, which are complementary outputs, change.

Now, assume that, in the differential amplifier circuit A1, the NMOS transistors main and mvr have the same electric characteristics, and so do the PMOS transistors m1a and m1b, and the PMOS transistors m2a and m2b, and that the load resistors RLa and RLb have the same resistance value RL. Then, if the two input voltages AIN and VR are equal to each other, then IDain=IDvr=ID0/2, and for the voltages vo and vob, vo=vob=RL (ID1-ID0/2), and this voltage value is the output common mode voltage of the differential amplifier circuit A1. Thus, the output common mode voltage of the differential amplifier circuit A1 is adjustable by feeding the post-low-pass-filtering feedback control voltage 118 back to the bias voltage vbp1 or vbp2.

It should be noted that the differential amplifier circuits in the A/D converter according to the present invention are not limited to the above-described configuration. The same effects are attainable, so long as differential amplifier circuits having the same function are used, such as differential amplifier circuits in which the PMOS transistors and the NMOS transistors are interchanged.

Figure 3:
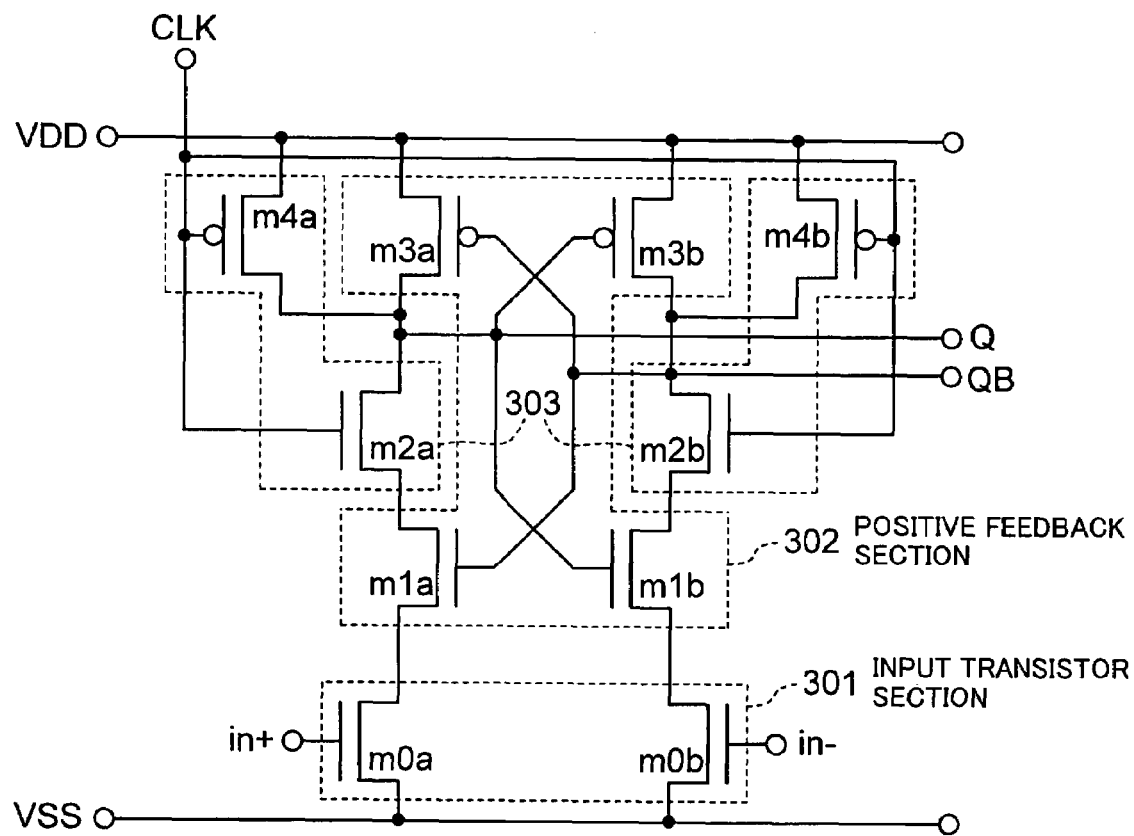
FIG. 3 is a view showing an example of the internal configuration of a voltage comparison circuit included in the A/D converter.

FIG. 3 shows an example of the configuration of the voltage comparison circuits Cr1 to Crm+1. This circuit is a dynamic voltage comparison circuit characterized by high-speed operation and low power consumption. The voltage comparison circuit Cr1 will be described as an example. In FIG. 3, the voltage comparison circuit Cr1 includes: an input transistor section 301, which includes an NMOS transistor m0a and an NMOS transistor m0b; a positive feedback section 302, in which an NMOS transistor m1a, an NMOS transistor m1b, a PMOS transistor m3a, and a PMOS transistor m3b form a cross inverter latch; and reset sections 303, which include an NMOS transistor m2a, an NMOS transistor m2b, a PMOS transistor m4a, and a PMOS transistor m4b. The voltage comparison circuit Cr1 has two input terminals in+ and in−. The input terminals in+ and in− receive the complementary positive and negative output voltages (vo) and (vob), respectively, of one of the differential amplifier circuits. The input terminals in+ and in− are connected with the gate terminals of the NMOS transistors m0a and m0b, respectively. The source terminals of the NMOS transistors m0a and m0b are connected to a ground voltage VSS, while the drain terminals thereof are connected to the source terminals of the NMOS transistors m1a and m1b, respectively. The drain terminals of the NMOS transistors 1a and m1b are connected to the source terminals of the NMOS transistors m2a and m2b, respectively. The gate terminal of the NMOS transistor m1a is connected to the gate terminal of the PMOS transistor m3a and to the respective drain terminals of the PMOS transistor m3b, NMOS transistor m2b, and PMOS transistor m4b. The gate terminal of the NMOS transistor m1b is connected to the gate terminal of the PMOS transistor m3b and to the respective drain terminals of the PMOS transistor m3a, NMOS transistor m2a, and PMOS transistor m4a. The source terminals of the PMOS transistors 3a, m3b, m4a, and m4b are connected to a power supply voltage VDD. The voltage comparison circuit Cr1 has two output terminals Q and QB for producing complementary outputs. The drain terminals of the PMOS transistors m3a and m3b are connected to the output terminals Q and QB, respectively. The gate terminals of the NMOS transistors m2a and m2b and the gate terminals of the PMOS transistors m4a and m4b are connected to a clock signal CLK.

In the following description, it is assumed that the input common mode voltage to the input terminals in+ and in− is biased so that the NMOS transistors m0a and m0b operate in a linear region.

When the clock signal CLK is at the "Low" level, the NMOS transistors m2a and m2b in the reset sections 303 are in the "OFF" state, while the PMOS transistors m4a and m4b in the reset sections 303 are in the "ON" state, whereby the output terminals Q and QB are pulled up to the power supply voltage VDD to cause both output terminals Q and QB to go to the "High" level (i.e., in the reset state). At this time, no current passes through the voltage comparison circuit Cr1.

When the clock signal CLK is at the "High" level, the NMOS transistors m2a and m2b in the reset sections 303 are in the "ON" state, while the PMOS transistors m4a and m4b in the reset sections 303 are in the "OFF" state, whereby the positive feedback section 302 is allowed to operate. According to the input terminals in+ and in− of the voltage comparison circuit Cr1, the drain voltages of the NMOS transistors m0a and m0b vary, and the positive feedback section 302 performs positive feedback and amplification of the differential voltage between those drain voltages. For instance, when the voltages of the input terminals satisfy the relation in+>in−, the drain voltage of the NMOS transistor m0a> the drain voltage of the NMOS transistor m0b. In this case, the output terminal Q is amplified to the power supply voltage VDD and the output terminal QB is amplified to the ground voltage VSS, whereby the output terminal Q goes to the "High" level and the output terminal QB outputs "Low" (i.e., in the comparison and latch state). At this time, current flows during the time the output terminals Q and QB are transitioning from the reset state, but once the outputs of the output terminals Q and QB are fixed at the "High" or "Low" level, the current no longer flows.

Thus, the dynamic voltage comparison circuit Cr1 described above has the advantage over typical constant-current voltage comparison circuits in that the dynamic voltage comparison circuit Cr1 can reduce current consumption considerably.

It should be noted that even in cases where the NMOS transistors m2a and m2b and the PMOS transistors m4a and m4b forming the reset sections 303 are not connected in the above-described manner, the same effects are attainable, so long as the reset sections 303 are configured to be able to perform the same operation.

It should also be noted that the output terminals Q and QB of the voltage comparison circuit Cr1 are not limited to the aforesaid locations. For example, the output terminal Q may be connected to the connection point at which the drain terminal of the NMOS transistor m1a and the source terminal of the NMOS transistor m2a are connected together, or to the connection point at which the drain terminal of the NMOS transistor m0a and the source terminal of the NMOS transistor m1a are connected together. And the output terminal QB may be connected to the connection point at which the drain terminal of the NMOS transistor m1b and the source terminal of the NMOS transistor m2b are connected together, or to the connection point at which the drain terminal of the NMOS transistor m0b and the source terminal of the NMOS transistor m1b are connected together. In those cases, the same effects are also attainable.

Figure 4:
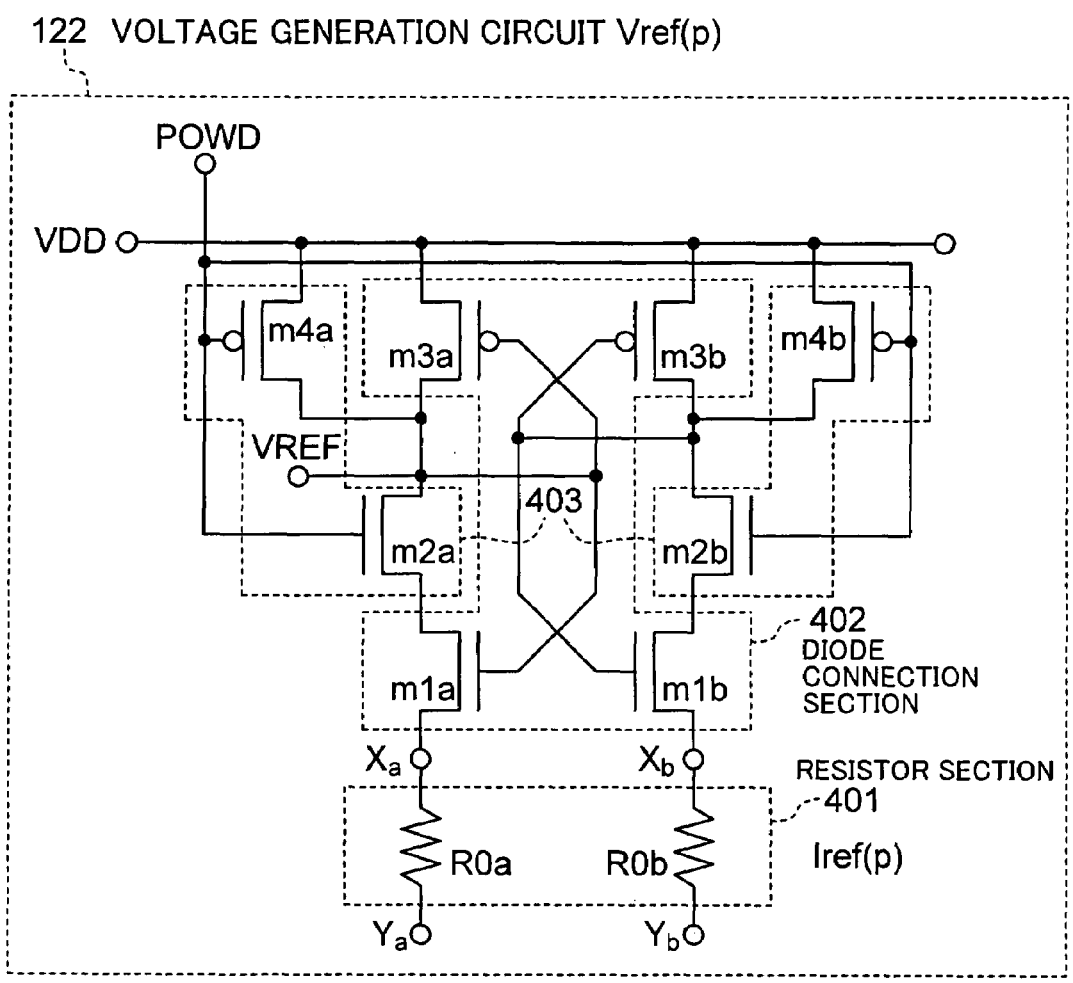
FIG. 4 is a view showing an example of the internal configuration of a voltage generation circuit included in the A/D converter.

FIG. 4 shows an example of the configuration of the voltage generation circuits 122, which exhibits a distinctive feature of the present invention. This is almost the same as the configuration of the voltage comparison circuit Cr1. The differences between the voltage comparison circuit Cr1 and the voltage generation circuit 122 are as follows: the input transistor section 301 in the voltage comparison circuit Cr1, which is composed of the NMOS transistors, is replaced in the voltage generation circuit 122 with a resistor section 401 composed of two resistors R0a and R0b; the positive feedback section 302 in the voltage comparison circuit Cr1 is replaced with a diode connection section 402 in the voltage generation circuit 122; the reset sections 303 in the voltage comparison circuit Cr1 are replaced with switch sections 403 in the voltage generation circuit 122; and the gate terminals of the transistors forming the reset sections 303 in the voltage comparison circuit Cr1 are connected to the clock terminal CLK, while the gate terminals of the transistors forming the switch sections 403 in the voltage generation circuit 122 are connected to a signal, which is always at the "High" level when the A/D converter operates. Also, the gate terminal of a PMOS transistor m3a is connected to a reference voltage output terminal VREF, from which a reference voltage is output.

Also, the voltage generation circuit 122 differs from the configuration of the above-described voltage generation circuit 722 of the conventional technique disclosed in Patent Document 3 in that while the two resistors R0a and R0b in the voltage generation circuit 722 of the conventional technique are each connected at one end thereof to the ground voltage VSS, the two resistors R0a and R0b in the voltage generation circuit 122 are not connected to a ground voltage VSS, but both ends of the two resistors R0a and R0b in the voltage generation circuit 122 are connection terminals Xa and Ya, and Xb and Yb that are connectable to external circuits. This is a distinctive feature of the present invention.

The voltage generation circuit 122 includes: the resistor section 401 composed of the resistors R0a and R0b; the diode connection section 402 composed of an NMOS transistor m1a, an NMOS transistor m1b, a PMOS transistor m3a, and a PMOS transistor m3b; and the switch sections 403 composed of an NMOS transistor m2a, an NMOS transistor m2b, a PMOS transistor m4a, and a PMOS transistor m4b. The load resistors R0a and R0b are connected at one end thereof to the source terminals of the NMOS transistors m1a and m1b, respectively, and their connection points are the connection terminals Xa and Xb. The other ends of the load resistors R0a and R0b are the connection terminals Ya and Yb. The drain terminals of the NMOS transistors m1a and m1b are connected to the source terminals of the NMOS transistors m2a and m2b, respectively. The gate terminal of the NMOS transistor m1a is connected to the gate terminal of the PMOS transistor m3a and to the drain terminals of the PMOS transistor m3a, NMOS transistor m2a, and PMOS transistor m4a. The gate terminal of the NMOS transistor m1b is connected to the gate terminal of the PMOS transistor m3b and to the drain terminals of the PMOS transistor m3b, NMOS transistor m2b, and PMOS transistor m4b. The source terminals of the MOS transistors m3a, m3b, m4a, and m4b are connected to a power supply voltage VDD. The voltage generation circuit 122 has the reference voltage output terminal VREF, which is connected to the gate terminal of the PMOS transistor m3a. The gate terminals of the NMOS transistors m2a and m2b and the gate terminals of the PMOS transistors m4a and m4b are connected to a switch signal POWD, which is always at the "High" level when the A/D converter operates.

Figure 5A:
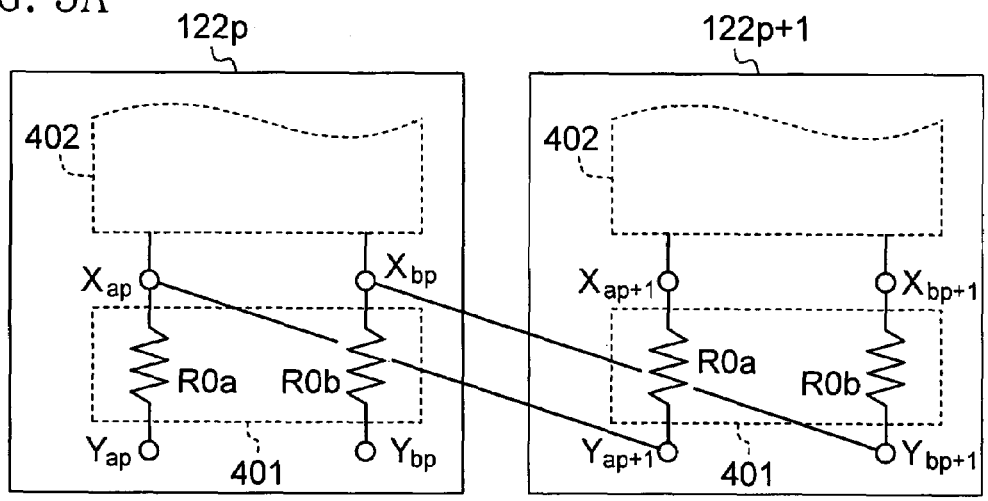
FIG. 5(a) shows first connection relation.

Next, a description will be made of connection relation in which the plurality of (n) voltage generation circuits 122, which are a distinctive feature of the present invention, are connected. FIG. 5 schematically shows examples of connection relation in which the resistors R0a and R0b in two of the voltage generation circuits 122, i.e., the p-th and p+1-th voltage generation circuits 122p and 122p+1, are connected (where p=any value from 1 to n). The connection terminal Xap in the p-th voltage generation circuit 122p is connected to the connection terminal Yap+1 in the p+1-th voltage generation circuit 122p+1, while the connection terminal Xbp in the p-th voltage generation circuit 122p is connected to the connection terminal Ybp+1 in the p+1-th voltage generation circuit 122p+1. In other words, the two voltage generation circuits 122p and 122p+1 have connection relation (first connection relation) in which the two resistors R0a are connected in series and the other two resistors R0b are also connected in series.

Figure 5B:
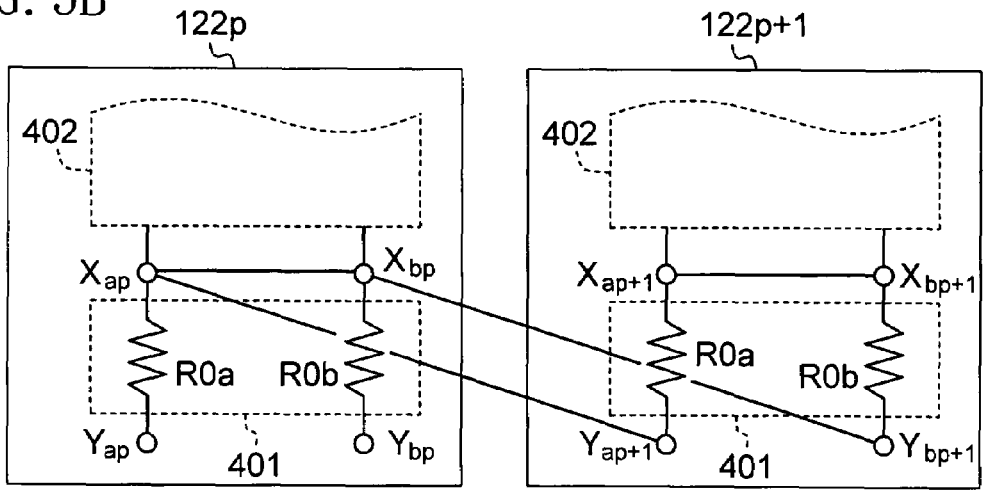
FIG. 5(b) shows second connection relation.
Figure 5C:
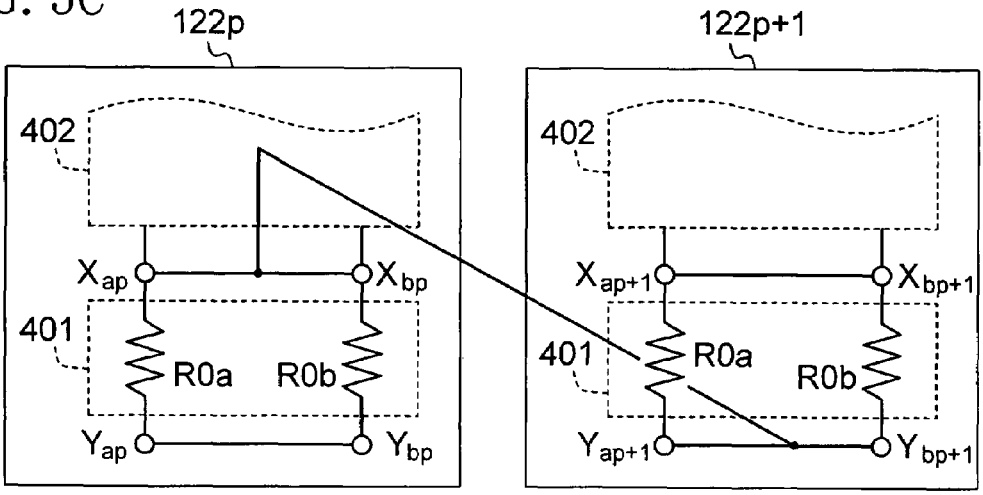
FIG. 5(c) shows third connection relation.

As shown in FIG. 5(b), in addition to the first connection relation, the two adjacent voltage generation circuits 122p and 122p+1 may have other connection relation (second connection relation), in which, in each of the voltage generation circuits 122p and 122p+1, the connection terminals Xap and Xbp thereof are connected together. Furthermore, as shown in FIG. 5(c), the voltage generation circuits 122p and 122p+1 may have third connection relation, in which the connection terminals Xa and Xb in each voltage generation circuit are connected together, and the connection terminals Ya and Yb therein are connected together, and then the connection terminals Yap, Ybp, Yap+1, and Ybp+1 in the two adjacent voltage generation circuits 122p and 122p+1 are connected by a single wire. In the case where the voltage generation circuits 122p and 122p+1 have the third connection relation, the two connection terminals Xa and Xb connected in each voltage generation circuit 122 are denoted by Xp (where p=1 to n) and the other two connected connection terminals Ya and Yb are denoted by Yp (where p=1 to n) in the voltage generation circuits 122 in the reference voltage generation circuit 119 shown in FIG. 1.

In the first to third connection relation, the connection terminal Y of at least one of the n voltage generation circuits 122 is connected to a predetermined potential (e.g., the ground voltage VSS).

Specifically, a description will be made of a case in which the connection terminal Y1 of the voltage generation circuit 122 whose p=1 is connected to the ground voltage VSS. In this case, it is assumed that the resistor R0$a$=R0$b$=R0 and that a current Irefp passes through the resistor section 401 in the p-th voltage generation circuit 122. Then, in the voltage generation circuit 122, the voltage Vrefp is equal to a voltage obtained when a resistance of px(R0/2) is connected between the connection terminal Xp and the ground potential VSS.

When the switch signal POWD is at the "Low" level, the NMOS transistors m2$a$ and m2$b$ in the switch sections 403 are in the "OFF" state, while the PMOS transistors m4$a$ and m4$b$ in the switch sections 403 are in the "ON" state, whereby the reference voltage output terminal VREF is pulled up to the power supply voltage VDD (i.e., in the power-down state). At this time, no current passes through the voltage generation circuit 122.

When the switch signal POWD is at the "High" level, the NMOS transistors m2$a$ and m2$b$ in the switch sections 403 are in the "ON" state, while the PMOS transistors m4$a$ and m4$b$ in the switch sections are in the "OFF" state, whereby the diode connection section 402 is allowed to operate. At this time, the NMOS transistors m1$a$, m1$b$, m2$a$ and m2$b$ and the PMOS transistors m3$a$ and m3$b$ can be considered to be resistors. At this time, if each of the voltage generation circuits 122 represented by the reference mark Vrefp generates a current and a voltage that allow bias conditions therein to be satisfied, and a current from the diode connection section 402 therein is Irefd, the following expression holds.

$$Irefp = \Sigma Irefx + Irefd \text{ (where } x \text{ is a value from } p+1 \text{ to } n\text{)}$$

By selecting the reference voltage output terminal VREF of each voltage generation circuit 122 at this time, the reference voltage 115 is adjustable.

As described above, the configuration of the voltage generation circuits 122 produces the following effects. The resistor section 401 in each voltage generation circuit 122 is shared to thereby reduce the area occupied by the resistors as compared with the voltage generation circuits 722 of the conventional technique, while the voltage generation circuits 122 have the identical configuration and thus can have the same layout shape. This provides the effect of preventing variation occurring during semiconductor fabrication, while enabling the output dynamic range of the differential amplifier circuits to accurately fall within the input dynamic range of the voltage comparison circuits, even if power supply voltage, temperature, or transistor characteristics vary. It is thus possible to prevent the accuracy of the A/D converter from decreasing due to those variations. In addition, the reference voltage 115 is adjusted in accordance with the received external control signal 123, whereby the operation margin is increased further.

It should be noted that although the connection terminal Y1 of the first voltage generation circuit 122 is connected to the ground potential VSS, the present invention is not limited to this. For example, the connection terminal Y1 of the first voltage generation circuit 122 and the connection terminal Yp+1 of the p+1-th voltage generation circuit 122 may be connected to the ground potential VSS so that the electric characteristics, e.g., the resistance value and the temperature coefficient, of the resistors used in the resistor sections 401 in the first to p-th voltage generation circuits 122 differ from those in the p+1-th to n-th voltage generation circuits 122. Then, it becomes possible to adjust the reference voltage 115 in two different steps or with two different temperature-compensation gradients.

In this embodiment, the average voltage generation circuit 112 is composed of the average voltage generation resistors a112$a$ and b112$b$. Nevertheless, if a circuit having the same function as the average voltage generation circuit 112 is used, the same effects are attainable.

Also, although the reference voltage output terminal VREF is connected to the gate terminal of the PMOS transistor m3$a$, the reference voltage output terminal VREF may be connected to other points. For example, since the gate terminal of the PMOS transistor m3$b$ has the same potential as the gate terminal of the PMOS transistor m3$a$, the reference voltage output terminal VREF may be connected to the gate terminal of the PMOS transistor m3$b$. Alternatively, in accordance with the location structure for the output terminals of the voltage comparison circuit Cr1, the reference voltage output terminal VREF may be connected, e.g., to the connection point where the drain terminal of the NMOS transistor m1$a$ and the source terminal of the NMOS transistor m2$a$ are connected together, to the connection point (Xa) where the resistor R0$a$ and the drain terminal of the NMOS transistor m1$a$ are connected together, to the connection point where the drain terminal of the NMOS transistor m1$b$ and the source terminal of the NMOS transistor m2$b$ are connected together, or to the connection point (Xb) where the resistor R0$b$ and the drain terminal of the NMOS transistor m1$b$ are connected together.

Moreover, in this embodiment, the average voltage generation circuit 112 is used to obtain the average voltage of the positive and negative output voltages of the voltage comparison circuit replica 109, and the obtained average voltage is used as the voltage comparison circuit common mode voltage 114. However, if an offset between the positive and negative output voltages of the voltage comparison circuit replica 109 caused by fabrication variation is negligible, the average voltage generation circuit 112 is not necessary. In this case, even if either the positive or negative output voltage of the voltage comparison circuit replica 109 is used as the voltage comparison circuit common mode voltage 114, the same effects are attainable and in addition the circuit size is reduced.

In this embodiment, the low pass filter 117 is composed of the filter resistor 117R and the filter capacitor 117C. However, the same effects are also obtainable by using a circuit having the same function as the low pass filter 117.

Also, the low pass filter 117 is used to remove the high-frequency component from the feedback control voltage 116 so as to obtain the post-low-pass-filtering feedback control voltage 118. However, if the effect of the high-frequency component contained in the feedback control voltage 116 on the characteristics of the A/D converter is negligible, the low pass filter 117 is not necessary. In this case, even if the feedback control voltage 116, instead of the post-low-pass-filtering feedback control voltage 118, is fed back to the differential amplifier circuit replica 108 and to the differential amplifier circuits A1 to Am+1, the same effects are achievable and in addition the circuit size is reduced.

The technique disclosed in this embodiment is also applicable to a technique such as disclosed in the above-described Patent Document 1 in which the output voltages of differential amplifier circuits are interpolated. Then, the output dynamic range of the differential amplifier circuits accurately falls within the input dynamic range of voltage comparison circuits.

SECOND EMBODIMENT

Next, a second embodiment of the present invention will be described.

Figure 6:
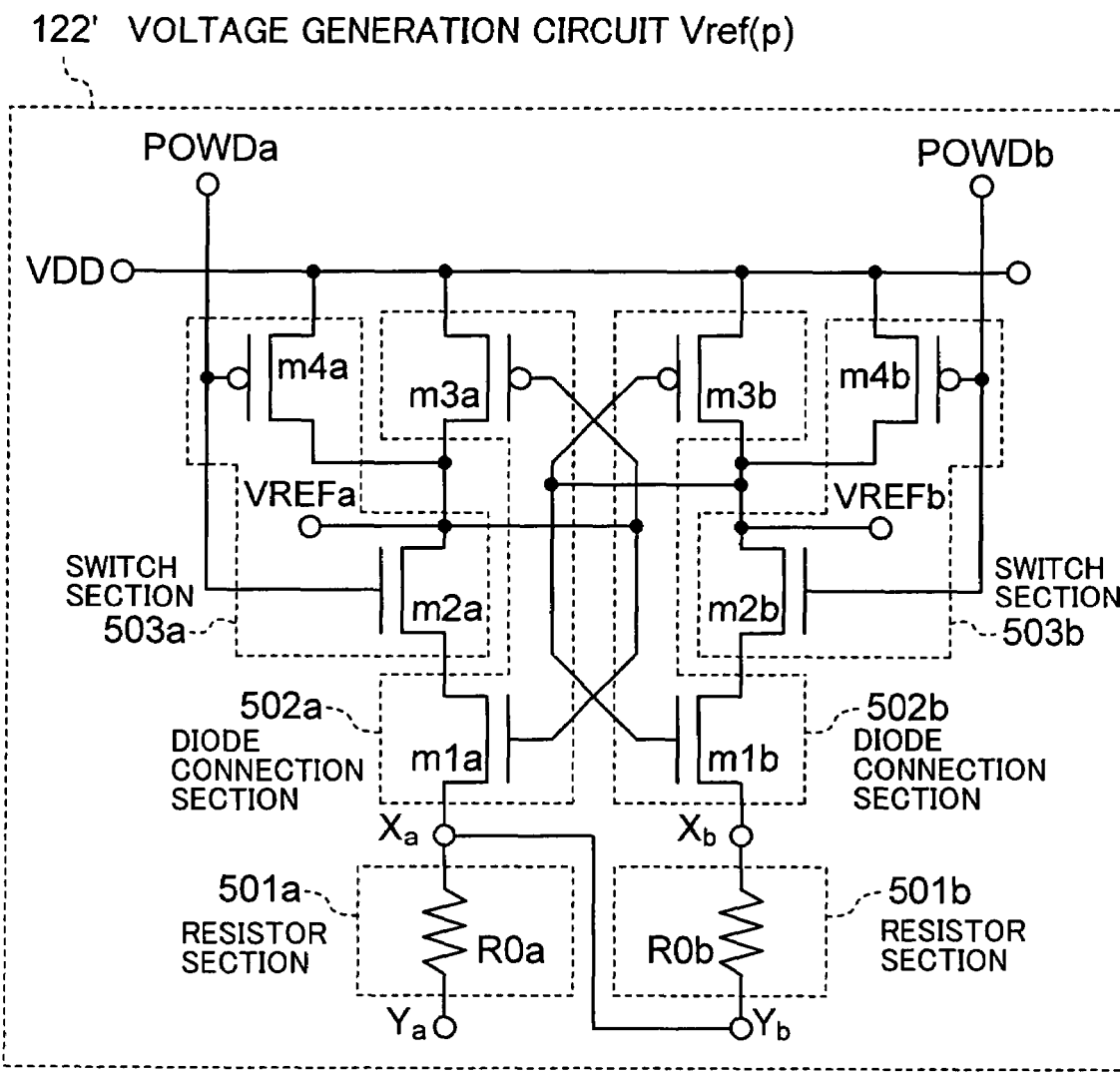
FIG. 6 is a view showing an example of the internal configuration of a voltage generation circuit included in an A/D converter according to a second embodiment of the present invention.
Figure 7:
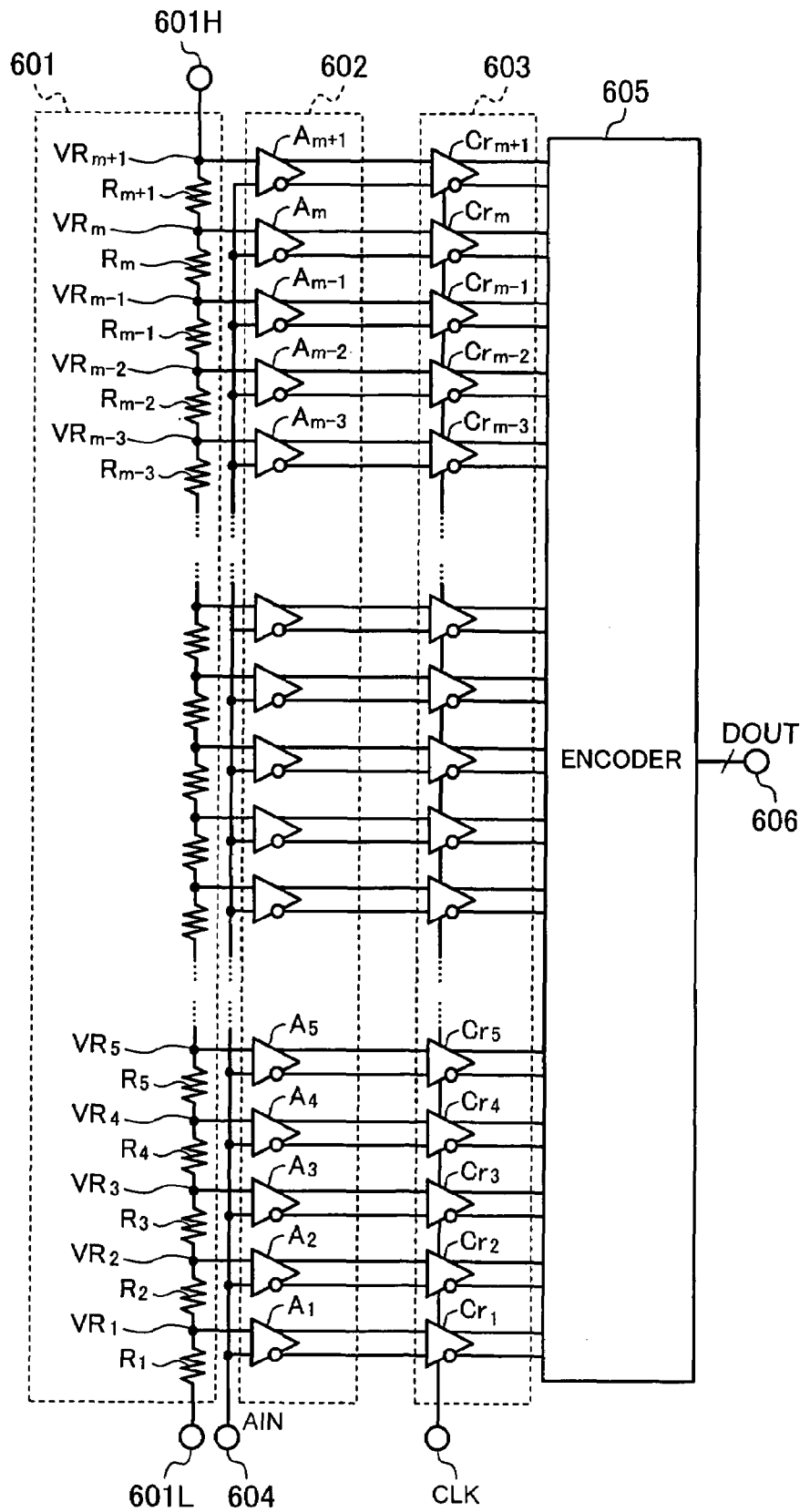
FIG. 7 is a view showing the entire configuration of an A/D converter according to a first conventional technique.
Figure 8:
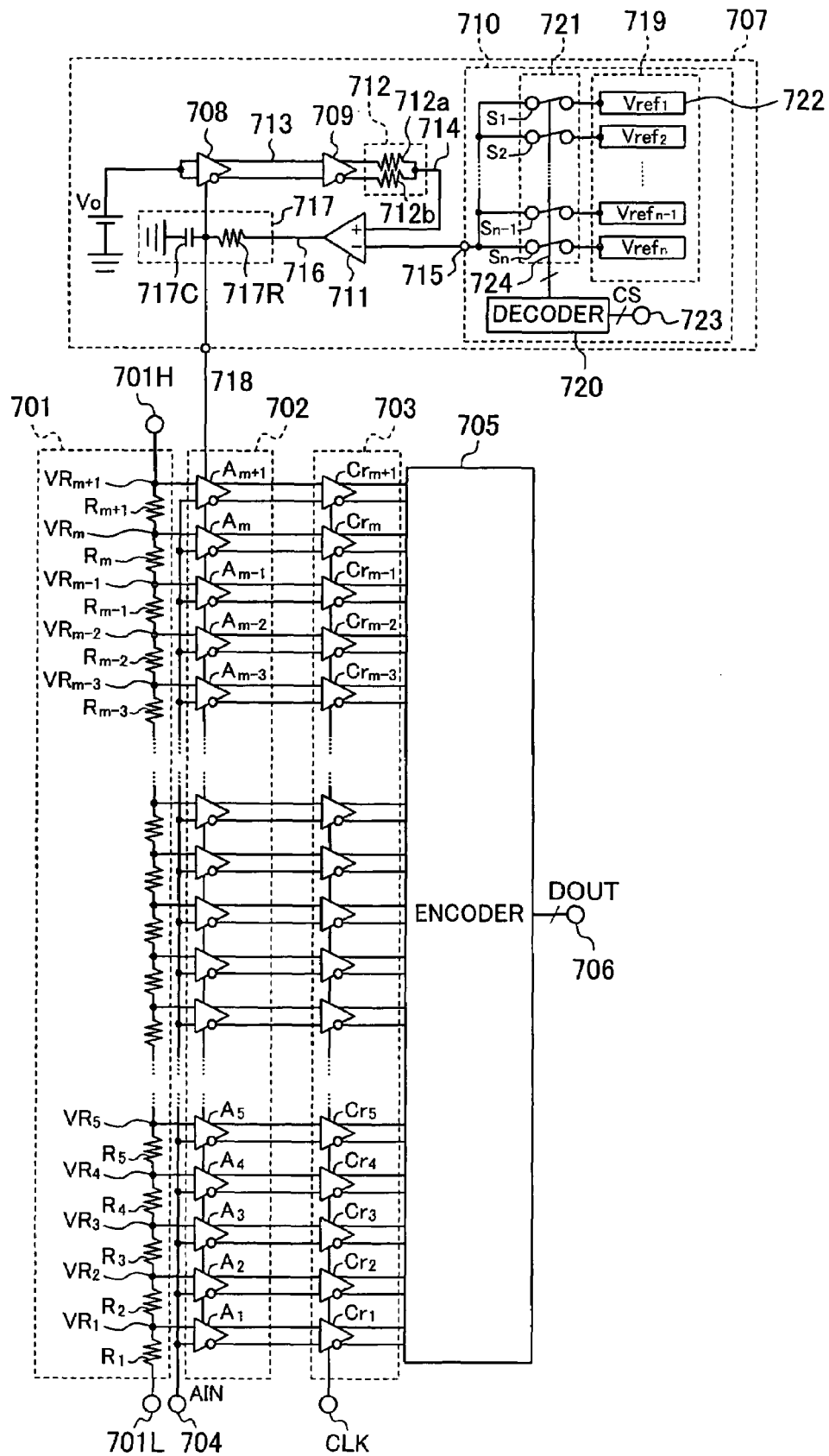
FIG. 8 is a view showing the entire configuration of an A/D converter according to a second conventional technique.
Figure 9:
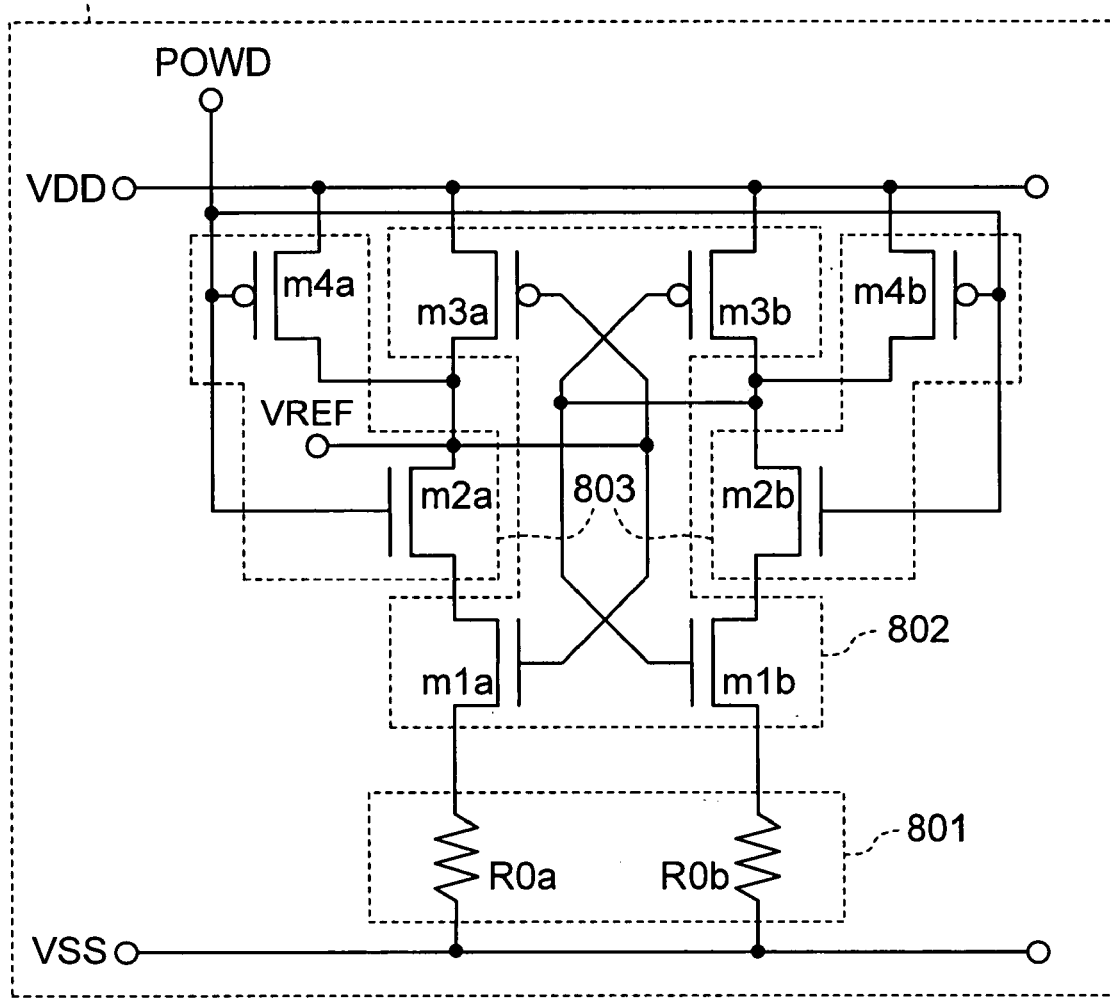
FIG. 9 is a view showing the internal configuration of a voltage generation circuit included in the A/D converter according to the second conventional technique.

FIG. 6 shows another example of the configuration of the voltage generation circuit 122 shown in FIG. 4, which is a distinctive feature of this embodiment. This is almost the same as the configuration of the voltage comparison circuit Cr1. The differences between the voltage comparison circuit Cr1 and the voltage generation circuit 122' are as follows: the input transistor section 301 in the voltage comparison circuit Cr1, which is composed of the NMOS transistors, is replaced in the voltage generation circuit 122' with a resistor section 501a composed of a single resistor R0a and a resistor section 501b composed of a single resistor R0b; the positive feedback section 302 in the voltage comparison circuit Cr1 is replaced with two diode connection sections 502a and 502b in the voltage generation circuit 122'; the reset sections 303 in the voltage comparison circuit Cr are replaced with two switch sections 503a and 503b in the voltage generation circuit 122'; and the gate terminals of the transistors forming the reset sections 303 in the voltage comparison circuit Cr1 are connected with the clock terminal CLK, but the gate terminals of the transistors forming the switch sections 503a and 503b in the voltage generation circuit 122' are connected with signals that are always at the "High" level when the A/D converter operates. And the gate terminal of a PMOS transistor m3a is connected to a reference voltage output terminal VREFa, while the gate terminal of a PMOS transistor m3b is connected to a reference voltage output terminal VREFb.

Differences between the voltage generation circuit 122 shown in FIG. 4 and the voltage generation circuit 122' shown in FIG. 6 are that the resistor section, the diode connection section, and the switch section are each divided into two as described above. The two diode connection sections 502a and 502b as a whole have the same configuration as the positive feedback section 302 shown in FIG. 3. In other words, the diode connection sections 502a and 502b are each formed by using only half of the circuit configuration (half-circuit) of the positive feedback section 302.

Also, the voltage generation circuit 122' is almost the same as the configuration of the voltage generation circuit 722 of the conventional technique disclosed in the above-described Patent Document 3, and the differences between the voltage generation circuit 722 of the conventional technique and the voltage generation circuit 122' are as follows. While the two resistors R0a and R0b in the voltage generation circuit 722 of the conventional technique are each connected at one end thereof to the ground voltage VSS, the two resistors R0a and R0b in the voltage generation circuit 122' are not connected to a ground voltage VSS, and the ends of the two resistors R0a and R0b in the voltage generation circuit 122' are connection terminals Xa, Ya, Xb, and Yb. The connection terminal Xa is connected with the connection terminal Yb, and the connection terminals Xb and Ya are connectable to external circuits. This is a distinctive feature of this embodiment.

The voltage generation circuit 122' includes: the resistor section 501a composed of the resistor R0a; the resistor section 501b composed of the resistor R0b; the diode connection section 502a composed of an NMOS transistor m1a and the PMOS transistor m3a; the diode connection section 502b composed of an NMOS transistor m1b and the PMOS transistor m3b; the switch section 503a composed of an NMOS transistor m2a and a PMOS transistor m4a; and the switch section 503b composed of an NMOS transistor m2b and a PMOS transistor m4b.

The resistors R0a and R0b are connected at one end thereof to the source terminals of the NMOS transistors m1a and m1b, respectively, and their connection points are the connection terminals Xa and Xb. The other ends of the resistors R0a and R0b are the connection terminals Ya and Yb. The connection terminals Xa and Yb are connected together. The drain terminals of the NMOS transistors m1a and m1b are connected to the source terminals of the NMOS transistors m2a and m2b, respectively. The gate terminal of the NMOS transistor m1a is connected to the gate terminal of the PMOS transistor m3a and to the drain terminals of the PMOS transistor m3a, NMOS transistor m2a, and PMOS transistor m4a. The gate terminal of the NMOS transistor m1b is connected to the gate terminal of the PMOS transistor m3b and to the drain terminals of the PMOS transistor m3b, NMOS transistor m2b, and PMOS transistor m4b. The source terminals of the PMOS transistors m3a, m3b, m4a, and m4b are connected to a power supply voltage VDD. The voltage generation circuit 122' has the reference voltage output terminals VREFa and VREFb, which are connected to the gate terminal of the PMOS transistor m3a and the gate terminal of the PMOS transistor m3b, respectively. The gate terminal of the NMOS transistor m2a and the gate terminal of the PMOS transistor m4a are connected to a switch signal POWDa, while the gate terminal of the NMOS transistor m2b and the gate terminal of the PMOS transistor m4b are connected to a switch signal POWDb. The switch signals POWDa and POWDa are always at the "High" level, when the A/D converter operates.

In this embodiment, it is assumed that the connection terminal Ya of at least one of the voltage generation circuits 122' is connected to a ground voltage VSS, and that the connection terminal Yap of each of the other remaining voltage generation circuits 122 is connected to the connection terminal Xap-1 of a different one of the voltage generation circuits 122', where p is any value from 1 to n. Furthermore, assume that the connection terminal Ya1 of the voltage generation circuit 122' whose p=1 is connected to the ground voltage VSS. It is also assumed that the resistor R0a=R0b=R0 and that a current Irefap and a current Irefbp pass through the resistor sections 501a and 501b, respectively, in the p-th voltage generation circuit 122'. Then, the configuration of the voltage generation circuit 122' is equivalent to a configuration in which a resistance of R0x((p−1)x2+1) is connected between the connection terminal Xap and the ground potential VSS and a resistance of R0xpx2 is connected between the connection terminal Xbp and the ground potential VSS.

When the switch signals POWDa and POWDb are at the "Low" level, the MOS transistors m2a and m2b in the switch sections 503a and 503b are in the "OFF" state, while the PMOS transistors m4a and m4b in the switch sections 503a and 503b are in the "ON" state, whereby the reference voltage output terminals VREFa and VREFb are pulled up to the power supply voltage VDD (i.e., in the power-down state). At this time, no current passes through the voltage generation circuit 122'.

When the switch signals POWDa and POWDb are at the "High" level, the NMOS transistors m2a and m2b in the switch sections 503a and 503b are in the "ON" state, while the PMOS transistors m4a and m4b in the switch sections 503a and 503b are in the "OFF" state, whereby the diode connection sections 502a and 502b are allowed to operate. At this time, the NMOS transistors m1a, m1b, m2a and m2b and the PMOS transistors m3a and m3b can be considered to be resistors. At this time, if each of the voltage generation circuits 122' generates a current and a voltage that allow bias conditions therein to be satisfied, and currents from the diode connection sections 502a and 502b therein are Irefda(p) and Irefdb(p), the following equations hold.

$$Irefa(p) = \Sigma Irefa(x) + \Sigma Irefb(y) + Irefda(p)$$

where x is each value from p+1 to n, and y is each value from p to n, and $$Irefb(p) = \Sigma Irefa(x) + \Sigma Irefb(y) + Irefdb(p)$$

where x is each value from p+1 to n, and y is each value from p+1 to n. By selecting the reference voltage output terminal VREFa or VREFb in each voltage generation circuit 122' at this time, the reference voltage 115 is adjustable.

As described above, the configuration of the voltage generation circuits 122' produces the following effects. The two resistor sections 501a and 501b in each voltage generation circuit 122' are shared to reduce by half the area occupied by the resistors as compared with the voltage generation circuit 722 of the conventional technique, while, even with the circuit size reduced by half, the voltage generation circuits 122' each generates one reference voltage as compared with the voltage generation circuits 122. In addition, while the area occupied by the voltage generation circuits 122' is reduced, the voltage generation circuits 122' have the identical configuration and thus can have the same layout shape. This provides the effect of preventing variation occurring during semiconductor fabrication, while enabling the output dynamic range of the differential amplifier circuits to accurately fall within the input dynamic range of the voltage comparison circuits, even if power supply voltage, temperature, or transistor characteristics vary. It is thus possible to prevent the accuracy of the A/D converter from decreasing due to those variations. Moreover, the reference voltage 115 is adjusted in accordance with the received external control signal 123, whereby the operation margin is increased further.

It should be noted that although the connection terminal Ya1 of the first voltage generation circuit 122' is connected to the ground potential VSS, the present invention is not limited to this. For example, the connection terminal Ya1 of the first voltage generation circuit 122' and the connection terminal Yap+1 of the p+1-th voltage generation circuit 122' may be connected to the ground potential VSS so that the electric characteristics, e.g., the resistance value and the temperature coefficient, of the resistors used in the resistor sections 501a or 501b in the first to p-th voltage generation circuits 122' differ from those in the p+1-th to n-th voltage generation circuits 122'. Then, it becomes possible to adjust the reference voltage 115 in two different steps or with two different temperature-compensation gradients.

Assume that R0a=CaxR0 and R0b=CbxR0 where Ca and Cb are the temperature coefficients of the resistors R0a and R0b, respectively. In this case, if these temperature coefficients Ca and Cb can be selected in any pair, such as positive and positive, positive and negative, or negative and negative, then R0a+R0b=(Ca+Cb)R0, for example. It is thus possible to set the temperature coefficient of the voltage generation circuit 122' to any value, thereby allowing temperature compensation to be performed for the voltage comparison circuits Cr.

In this embodiment, the gate terminals of the NMOS transistor m2a and PMOS transistor m4a and the gate terminals of the NMOS transistor m2b and PMOS transistor m4b are connected to the signals that are always at the "High" level when the A/D converter operates. However, in synchronization with the selection signal 124, the switch signals for one of the voltage generation circuits that has been selected as the reference voltage 115 may be put to the "High" level, and the switch signals for the voltage generation circuits that have not been selected as the reference voltage 115 may be put to the "Low" level, so that those voltage generation circuits that do not have to operate are stopped, whereby the power consumption by the reference voltage output circuit is reduced.

In the above description, the average voltage generation circuit 112 is composed of the average voltage generation resistors a112a and b112b. Nevertheless, if a circuit having the same function as the average voltage generation circuit 112 is used, the same effects are attainable.

Also, in this embodiment, the reference voltage output terminals VREFa and VREFb are connected to the gate terminals of the PMOS transistors m3a and m3b, respectively. Nevertheless, the same effects are attainable, even if, in accordance with the location structure for the output terminals of the voltage comparison circuit Cr, the reference voltage output terminals VREFa and VREFb are connected, e.g., to the connection point where the drain terminal of the NMOS transistor m1a and the source terminal of the NMOS transistor m2a are connected together and to the connection point where the drain terminal of the NMOS transistor m1b and the source terminal of the NMOS transistor m2b are connected together, respectively, or to the connection point (Xa) where the resistor R0a and the drain terminal of the NMOS transistor m1a are connected together and to the connection point (Xb) where the resistor R0b and the drain terminal of the NMOS transistor m1b are connected together, respectively.

Moreover, in this embodiment, the average voltage generation circuit 112 is used to obtain the average voltage of the positive and negative output voltages of the voltage comparison circuit replica 109, and the obtained average voltage is used as the voltage comparison circuit common mode voltage 114. However, if an offset between the positive and negative output voltages of the voltage comparison circuit replica 109 caused by fabrication variation is negligible, the average voltage generation circuit 112 is not necessary. In this case, even if either the positive or negative output voltage of the voltage comparison circuit replica 109 is used as the voltage comparison circuit common mode voltage 114, the same effects are attainable and in addition the circuit size is reduced.

Furthermore, in this embodiment, the low pass filter 117 is composed of the filter resistor 117R and the filter capacitor 117C. However, the same effects are also obtainable by using a circuit having the same function as the low pass filter 117.

Also, the low pass filter 117 is used to remove the high-frequency component from the feedback control voltage 116 so as to obtain the post-low-pass-filtering feedback control voltage 118. However, if the effect of the high-frequency component contained in the feedback control voltage 116 on the characteristics of the A/D converter is negligible, the low pass filter 117 is not necessary. In this case, even if the feedback control voltage 116, instead of the post-low-pass-filtering feedback control voltage 118, is fed back to the differential amplifier circuit replica 108 and to the differential amplifier circuits A1 to Am+1, the same effects are achievable and in addition the circuit size is reduced.

The technique disclosed in this embodiment is also applicable to a technique such as disclosed in the above-described Patent Document 1 in which the output voltages of differential amplifier circuits are interpolated. Then, the output dynamic range of the differential amplifier circuits accurately falls within the input dynamic range of voltage comparison circuits.

INDUSTRIAL APPLICABILITY

As described previously, in the A/D converter according to the present invention, the area of the reference voltage output circuit that generates a plurality of reference voltages and selects and outputs one of the reference voltages is reduced effectively, while the output dynamic range of the differential amplifier circuits accurately falls within the input dynamic range of the voltage comparison circuits. The present invention is thus widely applicable to systems in consumer products which include therein devices containing this A/D converter, e.g., to digital data playback systems in DVD players and in DVD recorders and to demodulation systems in digital TVs.

The invention claimed is:

1. An A/D converter comprising:
   a referential voltage generation circuit for generating a plurality of referential voltages;
   a differential amplifier circuit row, in which a plurality of differential amplifier circuits corresponding to the referential voltages generated by the referential voltage generation circuit are included, each of the differential amplifier circuits receiving a corresponding one of the referential voltages and a common input signal voltage, amplifying a voltage difference between the corresponding referential voltage and the common input signal voltage, and outputting a positive output voltage and a negative output voltage, which are complementary voltages;
   a voltage comparison circuit row, in which a plurality of voltage comparison circuits corresponding to the differential amplifier circuits are included, each of the voltage comparison circuits outputting a digital signal according to a result of comparing the magnitudes of the positive and negative output voltages from a corresponding one of the differential amplifier circuits;
   an encoder for encoding the digital signals output from the voltage comparison circuits and outputting a result of the encoding of the digital signals as a digital output signal according to the common input signal voltage; and
   an adjusting circuit for adjusting the positive and negative output voltages from the differential amplifier circuits so that those positive and negative output voltages fall within an input range of the voltage comparison circuits,
   wherein the adjusting circuit includes a reference voltage output circuit, which has therein a plurality of voltage generation circuits each for generating a reference voltage and selects and outputs one of the reference voltages;
   the voltage generation circuits each include a resistor for reference voltage generation; and
   the resistors in at least two of the voltage generation circuits are connected in series.

2. The A/D converter of claim 1, wherein in the at least two voltage generation circuits whose resistors are connected in series, one of the series-connected resistors that is located at an end thereof is connected to a predetermined potential.

3. The A/D converter of claim 1, wherein each of the voltage comparison circuits includes:
   an input transistor section for receiving the positive and negative output voltages from the corresponding differential amplifier circuit, and
   a positive feedback section connected to the input transistor section and forming a cross inverter latch;
   each of the voltage generation circuits includes a diode connection section having the same configuration as the positive feedback sections in the differential amplifier circuits; and
   each of the voltage generation circuits includes two said resistors, and each of the two resistors is connected at one end thereof to the diode connection section and connected at the other end thereof to one end of a resistor in another voltage generation circuit.

4. The A/D converter of claim 1, wherein the adjusting circuit includes:
   a differential amplifier circuit replica, which has the same circuit and shape as the differential amplifier circuits, receives a feedback control voltage for output voltage adjustment supplied to the differential amplifier circuits, and outputs a differential amplifier circuit common mode voltage;
   a voltage comparison circuit replica, which has the same circuit and shape as the voltage comparison circuits, receives the differential amplifier circuit common mode voltage output from the differential amplifier circuit replica, and outputs a voltage comparison circuit common mode voltage according to the differential amplifier circuit common mode voltage; and
   an operational amplifier circuit for generating the feedback control voltage and feeding the feedback control voltage back to the differential amplifier circuit replica and to the differential amplifier circuits so that the voltage comparison circuit common mode voltage output from the voltage comparison circuit replica and the reference voltage selected and output by the reference voltage output circuit match.

5. The A/D converter of claim 1, wherein each of the voltage comparison circuits includes:
   an input transistor section for receiving the positive and negative output voltages from the corresponding differential amplifier circuit, and
   a positive feedback section connected to the input transistor section and forming a cross inverter latch;
   each of the voltage generation circuits includes two diode connection sections each having the same configuration as one of two symmetric half-circuits forming the positive feedback section in each of the differential amplifier circuits; and
   each of the voltage generation circuits includes two said resistors, the two resistors are connected at one end thereof to the two diode connection sections, and the other end of one of the two resistors is connected to the one end of the other resistor.

6. The A/D converter of claim 1, wherein the reference voltage output circuit includes a decoder for receiving an external control signal and generating a selection signal for selecting one of the voltage generation circuits in accordance with the control signal, and
   each of the voltage generation circuits operates when the voltage generation circuit receives the selection signal from the decoder, and stops when the voltage generation circuit does not receive the selection signal.

7. The A/D converter of claim 4, wherein the adjusting circuit further includes an average voltage generation circuit, provided between the voltage comparison circuit replica and the operational amplifier circuit, for receiving a positive output voltage and a negative output voltage output from the voltage comparison circuit replica and generating an average voltage of the positive and negative output voltages as the voltage comparison circuit common mode voltage, and the operational amplifier circuit generates the feedback control voltage so that the voltage comparison circuit common mode voltage output from the average voltage generation circuit matches the reference voltage selected and output by the reference voltage output circuit.

8. The A/D converter of claim 4, wherein the adjusting circuit further includes a low pass filter, disposed to an output side of the operational amplifier circuit, for removing a high-frequency component from the feedback control voltage output from the operational amplifier circuit.

9. The A/D converter of claim 1, wherein each of the resistors included in the voltage generation circuits is a combination of resistors having a positive temperature dependent characteristic, a combination of resistors having a negative temperature dependent characteristic, or a combination of resistors having a positive temperature dependent characteristic and a negative temperature dependent characteristic.

* * * * *